(12) United States Patent
Inada et al.

(10) Patent No.: US 10,962,600 B2
(45) Date of Patent: Mar. 30, 2021

(54) INVERTER CONTROL DEVICE AND POWER CONVERSION DEVICE

(71) Applicant: Hitachi Automotive Systems, Ltd., Hitachinaka (JP)

(72) Inventors: Ryoichi Inada, Tokyo (JP); Teppei Hirotsu, Tokyo (JP); Satoru Shigeta, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 35 days.

(21) Appl. No.: 16/302,131

(22) PCT Filed: Apr. 11, 2017

(86) PCT No.: PCT/JP2017/014770
§ 371 (c)(1),
(2) Date: Nov. 16, 2018

(87) PCT Pub. No.: WO2017/199643
PCT Pub. Date: Nov. 23, 2017

(65) Prior Publication Data
US 2019/0187219 A1    Jun. 20, 2019

(30) Foreign Application Priority Data

May 17, 2016    (JP) .............................. JP2016-098367

(51) Int. Cl.
*G01R 31/3842*    (2019.01)
*H02M 7/48*    (2007.01)
(Continued)

(52) U.S. Cl.
CPC .......... *G01R 31/3842* (2019.01); *B60L 58/13* (2019.02); *H02M 7/48* (2013.01); *H02M 7/537* (2013.01); *H02P 23/0004* (2013.01)

(58) Field of Classification Search
None
See application file for complete search history.

(56) References Cited

U.S. PATENT DOCUMENTS 8,514,600 B1 * 8/2013 Ichihara ............ H02M 7/53875
363/98
2003/0076030 A1    4/2003 Kim et al.
(Continued)

FOREIGN PATENT DOCUMENTS

| JP | 11-355903 A | 12/1999 |
| JP | 2005-27379 A | 1/2005 |

(Continued)

OTHER PUBLICATIONS

International Search Report (PCT/ISA/210) issued in PCT Application No. PCT/JP2017/014770 dated Jun. 13, 2017 with partial English translation (seven (7) pages).

(Continued)

*Primary Examiner* — Jas A Sanghera
(74) *Attorney, Agent, or Firm* — Crowell & Moring LLP

(57) ABSTRACT

To carry out diagnosis of a current sensor while maintaining high reliability. An inverter control device according to the present invention controls an inverter circuit, calculates an estimated direct current value on the basis of a duty value and an alternating current sensor value output by an alternating current sensor, and performs diagnosis of a direct current sensor on the basis of the estimated direct current value and a direct current sensor value output by the direct current sensor.

13 Claims, 16 Drawing Sheets

(51) Int. Cl.
 *B60L 58/13* (2019.01)
 *H02M 7/537* (2006.01)
 *H02P 23/00* (2016.01)

(56) References Cited

U.S. PATENT DOCUMENTS

| | | | |
|---|---|---|---|
| 2011/0221369 A1* | 9/2011 | Welchko | H02P 29/0241 |
| | | | 318/400.22 |
| 2011/0279071 A1* | 11/2011 | Yamada | H02P 21/0021 |
| | | | 318/400.02 |

FOREIGN PATENT DOCUMENTS

| | | |
|---|---|---|
| JP | 3795447 B2 | 7/2006 |
| JP | 2011-91962 A | 5/2011 |
| JP | 2013-21857 A | 1/2013 |

OTHER PUBLICATIONS

Japanese-language Written Opinion (PCT/ISA/237) issued in PCT Application No. PCT/JP2017/014770 dated Jun. 13, 2017 (four (4) pages).

\* cited by examiner

FIG. 10

| VALUE OF CORRECTION COEFFICIENT K | CORRECTION AMOUNT Ic | ERROR BETWEEN ESTIMATED DIRECT CURRENT VALUES AFTER CORRECTION Idcc AND ACTUAL DIRECT CURRENT (MAXIMUM VALUE) | ERROR BETWEEN AVERAGE VALUE OF ESTIMATED DIRECT CURRENT VALUES AFTER CORRECTION Idcc AND ACTUAL DIRECT CURRENT |
|---|---|---|---|
| 0.0 | 0 | Ioff | Ioff × 0.5 |
| 0.1 | Ioff × 0.1 | Ioff × 0.9 | Ioff × 0.4 |
| 0.2 | Ioff × 0.2 | Ioff × 0.8 | Ioff × 0.3 |
| 0.3 | Ioff × 0.3 | Ioff × 0.7 | Ioff × 0.2 |
| 0.4 | Ioff × 0.4 | Ioff × 0.6 | Ioff × 0.1 |
| 0.5 | Ioff × 0.5 | Ioff × 0.5 | 0 |
| 0.6 | Ioff × 0.6 | Ioff × 0.6 | Ioff × 0.1 |
| 0.7 | Ioff × 0.7 | Ioff × 0.7 | Ioff × 0.2 |
| 0.8 | Ioff × 0.8 | Ioff × 0.8 | Ioff × 0.3 |
| 0.9 | Ioff × 0.9 | Ioff × 0.9 | Ioff × 0.4 |
| 1.0 | Ioff | Ioff | Ioff × 0.5 |

FIG. 12

| VALUE OF CORRECTION COEFFICIENT K | CORRECTION AMOUNT Ic | ERROR BETWEEN ESTIMATED DIRECT CURRENT VALUES AFTER CORRECTION Idcc AND ACTUAL DIRECT CURRENT (MAXIMUM VALUE) | ERROR BETWEEN AVERAGE VALUE OF ESTIMATED DIRECT CURRENT VALUES AFTER CORRECTION Idcc AND ACTUAL DIRECT CURRENT |
|---|---|---|---|
| 0.0 | 0 | Ioff × 1.5 | Ioff × 1.0 |
| 0.1 | Ioff × 0.2 | Ioff × 1.3 | Ioff × 0.8 |
| 0.2 | Ioff × 0.4 | Ioff × 1.1 | Ioff × 0.6 |
| 0.3 | Ioff × 0.6 | Ioff × 0.9 | Ioff × 0.4 |
| 0.4 | Ioff × 0.8 | Ioff × 0.7 | Ioff × 0.2 |
| 0.5 | Ioff × 1.0 | Ioff × 0.5 | 0 |
| 0.6 | Ioff × 1.2 | Ioff × 0.7 | Ioff × 0.2 |
| 0.7 | Ioff × 1.4 | Ioff × 0.9 | Ioff × 0.4 |
| 0.8 | Ioff × 1.6 | Ioff × 1.1 | Ioff × 0.6 |
| 0.9 | Ioff × 1.8 | Ioff × 1.3 | Ioff × 0.8 |
| 1.0 | Ioff × 2.0 | Ioff × 1.5 | Ioff × 1.0 |

FIG. 14

| VALUE OF CORRECTION COEFFICIENT K | CORRECTION AMOUNT Ic | ERROR BETWEEN ESTIMATED DIRECT CURRENT VALUES AFTER CORRECTION Idcc AND ACTUAL DIRECT CURRENT (MAXIMUM VALUE) | ERROR BETWEEN AVERAGE VALUE OF ESTIMATED DIRECT CURRENT VALUES AFTER CORRECTION Idcc AND ACTUAL DIRECT CURRENT |
|---|---|---|---|
| 0.0 | 0 | Ioff × 1.5 | Ioff × 1.5 |
| 0.1 | Ioff × 0.3 | Ioff × 1.2 | Ioff × 1.2 |
| 0.2 | Ioff × 0.6 | Ioff × 0.9 | Ioff × 0.9 |
| 0.3 | Ioff × 0.9 | Ioff × 0.6 | Ioff × 0.6 |
| 0.4 | Ioff × 1.2 | Ioff × 0.3 | Ioff × 0.3 |
| 0.5 | Ioff × 1.5 | 0 | 0 |
| 0.6 | Ioff × 1.8 | Ioff × 0.3 | Ioff × 0.3 |
| 0.7 | Ioff × 2.1 | Ioff × 0.6 | Ioff × 0.6 |
| 0.8 | Ioff × 2.4 | Ioff × 0.9 | Ioff × 0.9 |
| 0.9 | Ioff × 2.7 | Ioff × 1.2 | Ioff × 1.2 |
| 1.0 | Ioff × 3.0 | Ioff × 1.5 | Ioff × 1.5 |

FIG. 16

| VALUE OF CORRECTION COEFFICIENT K | CORRECTION AMOUNT Ic | ERROR BETWEEN ESTIMATED DIRECT CURRENT VALUES AFTER CORRECTION Idcc AND ACTUAL DIRECT CURRENT (MAXIMUM VALUE) | ERROR BETWEEN AVERAGE VALUE OF ESTIMATED DIRECT CURRENT VALUES AFTER CORRECTION Idcc AND ACTUAL DIRECT CURRENT |
|---|---|---|---|
| 0.0 | 0 | Imax × Ig × 1.0 | Imax × Ig × 0.25 |
| 0.1 | Iu × Ig × 0.1 | Imax × Ig × 0.9 | Imax × Ig × 0.25 |
| 0.2 | Iu × Ig × 0.2 | Imax × Ig × 0.8 | Imax × Ig × 0.25 |
| 0.3 | Iu × Ig × 0.3 | Imax × Ig × 0.7 | Imax × Ig × 0.25 |
| 0.4 | Iu × Ig × 0.4 | Imax × Ig × 0.6 | Imax × Ig × 0.25 |
| 0.5 | Iu × Ig × 0.5 | Imax × Ig × 0.5 | Imax × Ig × 0.25 |
| 0.6 | Iu × Ig × 0.6 | Imax × Ig × 0.6 | Imax × Ig × 0.25 |
| 0.7 | Iu × Ig × 0.7 | Imax × Ig × 0.7 | Imax × Ig × 0.25 |
| 0.8 | Iu × Ig × 0.8 | Imax × Ig × 0.8 | Imax × Ig × 0.25 |
| 0.9 | Iu × Ig × 0.9 | Imax × Ig × 0.9 | Imax × Ig × 0.25 |
| 1.0 | Iu × Ig × 1.0 | Imax × Ig × 1.0 | Imax × Ig × 0.25 | ns
INVERTER CONTROL DEVICE AND POWER CONVERSION DEVICE

TECHNICAL FIELD

The present invention relates to an inverter control device and a power conversion device, and in particular to an inverter control device and a power conversion device for driving a vehicle.

BACKGROUND ART

A power conversion device is mounted to drive a motor in hybrid vehicles and electric vehicles. The power conversion device switches a power semiconductor in an inverter circuit to convert a direct current supplied from a battery into an alternating current to drive the motor.

In the power conversion device, a direct current sensor that measures the direct current supplied from the battery to the inverter circuit is mounted in addition to a three-phase alternating current sensor that measures a current flowing in the motor.

In recent years, due to issuance of the functional safety standards for automobiles, necessity of detecting abnormality/failure in the power conversion device has been increased. Therefore, it is necessary to perform diagnostic processing of detecting abnormality/failure for the direct current sensor.

There is PTL 1 as a background art in the present technical field. PTL 1 discloses "when a current command value for a PDU 3 is set as a torque command value of a motor 1, feedback computing units 14a and 14b compare a phase current to be supplied to the motor 1 with the current command value and calculate a voltage command value in such a way that the motor 1 is driven according to the torque command value. A voltage loss corrector of a current sensor failure detector 19 corrects a loss in the PDU 3 with respect to the voltage command value, and calculates a voltage command value after correction actually supplied to the motor 1. Further, since an inverter current estimator of the current sensor failure detector 19 calculates a PDU current estimated to flow to the PDU 3 on the basis of the current command value and the voltage command value after correction, current sensor determination means of the current sensor failure detector 19 compares a battery current detected by a battery current sensor 5 and a PDU current to determine presence or absence of abnormality in the battery current sensor 5".

CITATION LIST

Patent Literature

PTL 1: JP 3795447 B

SUMMARY OF INVENTION

Technical Problem

In PTL 1, the PDU current is calculated using the current command value and the voltage command value after loss correction, and the PDU current and the battery current measured by the battery current sensor are compared, whereby the abnormality of the battery current sensor is diagnosed. However, a certain amount of time is required until the actual battery current is changed after the current command value or the voltage command value is changed. Therefore, if the diagnosis is performed according to the present system immediately after the current command value or the voltage command value is changed, or immediately after target torque that is a factor to determine the current command value or the voltage command value is changed, deviation occurs between a PDU current value and a battery current value even if the battery current sensor is normal, and there is a risk of occurrence of abnormality misdetection of the battery current sensor. Therefore, the present system has a problem that the diagnosis of the battery current sensor cannot be performed immediately after the change of the target torque.

An object of the present invention is to carry out diagnosis of a current sensor while maintaining high reliability.

Solution to Problem

An inverter control device according to the present invention controls an inverter circuit, calculates an estimated direct current value on the basis of a duty value and an alternating current sensor value output by an alternating current sensor, and performs diagnosis of a direct current sensor on the basis of the estimated direct current value and a direct current sensor value output by the direct current sensor.

A power conversion device according to the present invention is a power conversion device including an inverter circuit, an alternating current sensor, a direct current sensor, and an inverter control unit, in which the inverter control unit controls the inverter circuit such that a motor is driven according to target torque, and computes an estimated direct current value on the basis of a duty value and the alternating current sensor value, and performs diagnosis of the direct current sensor on the basis of the estimated direct current value and a direct current sensor value output by the direct current sensor.

Advantageous Effects of Invention

According to the present invention, diagnosis of a current sensor can be carried out while maintaining high reliability.

BRIEF DESCRIPTION OF DRAWINGS

FIG. 10 is a diagram illustrating a difference in the correction effect according to values of correction coefficients K in the example of FIG. 9.

FIG. 12 is a diagram illustrating a difference in the correction effect according to values of correction coefficients K in the example of FIG. 11.

FIG. 14 is a diagram illustrating a difference in the correction effect according to values of correction coefficients K in the example of FIG. 13.

FIG. 16 is a diagram illustrating a difference in the correction effect according to values of correction coefficients K in the example of FIG. 15.

DESCRIPTION OF EMBODIMENTS

In the present embodiment, an estimated direct current value is calculated from an alternating current sensor value and duty values of phases, and diagnosis of a direct current sensor is performed on the basis of a direct current sensor value output by a direct current sensor and the estimated direct current value.

Since a time delay between the direct current flowing from the battery to the inverter circuit and the alternating current flowing in the motor is small, the deviation between the estimated direct current value and the direct current sensor value is small unless the direct current sensor is abnormal. Therefore, in the present method, the diagnosis of the direct current sensor is constantly possible.

Problems, configurations, and effects other than those described above will be clarified from the description of the following embodiments. Hereinafter, embodiments will be described with reference to the drawings.

First Embodiment

In the present embodiment, an example of a power conversion device capable of constantly diagnosing abnormality of a direct current sensor will be described.

Figure 1:
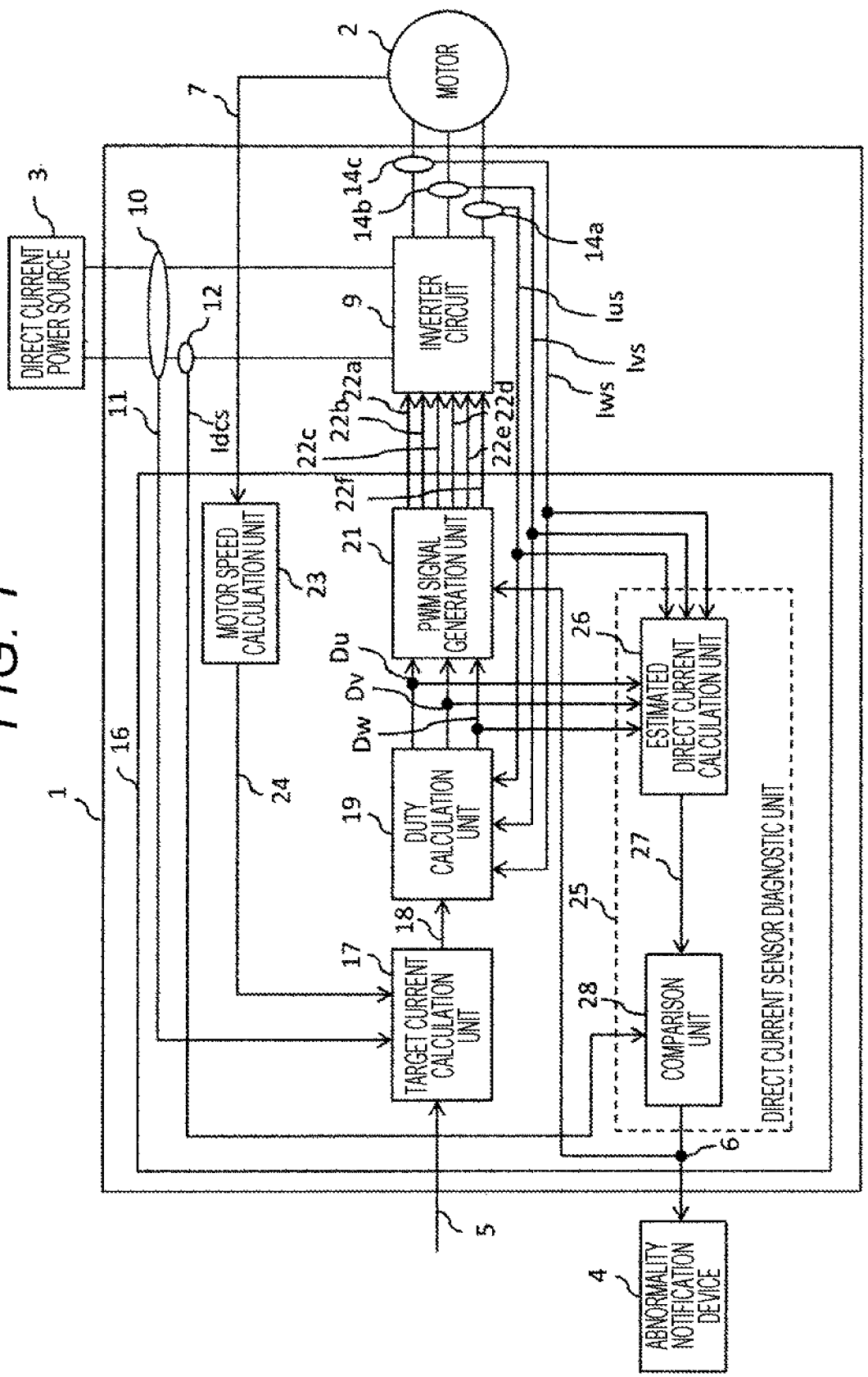
FIG. 1 is a diagram illustrating a configuration example of a power conversion device and a peripheral circuit in a first embodiment.

FIG. 1 is a diagram illustrating a configuration example of a power conversion device a peripheral circuit in a first embodiment.

A direct current power source 3 is a power source for driving a motor 2, and corresponds to a battery, for example. A power conversion device 1 converts direct current power obtained from the direct current power source into alternating current power to drive the motor 2. Further, the power conversion device 1 also has a function to convert power of the motor 2 into direct current power to charge the direct current power source 3.

The motor 2 is a three-phase electric motor having three windings. Further, in the motor 2, an angle sensor (not illustrated) for measuring a rotation angle of the motor is mounted, and the angle sensor outputs a measured rotation angle of the motor 2 to the power conversion device 1 as an angle sensor value 7.

The power conversion device 1 includes an inverter control device 16, an inverter circuit 9, alternating current sensors 14a to 14c, a voltage sensor 10, and a direct current sensor 12.

Figure 2:
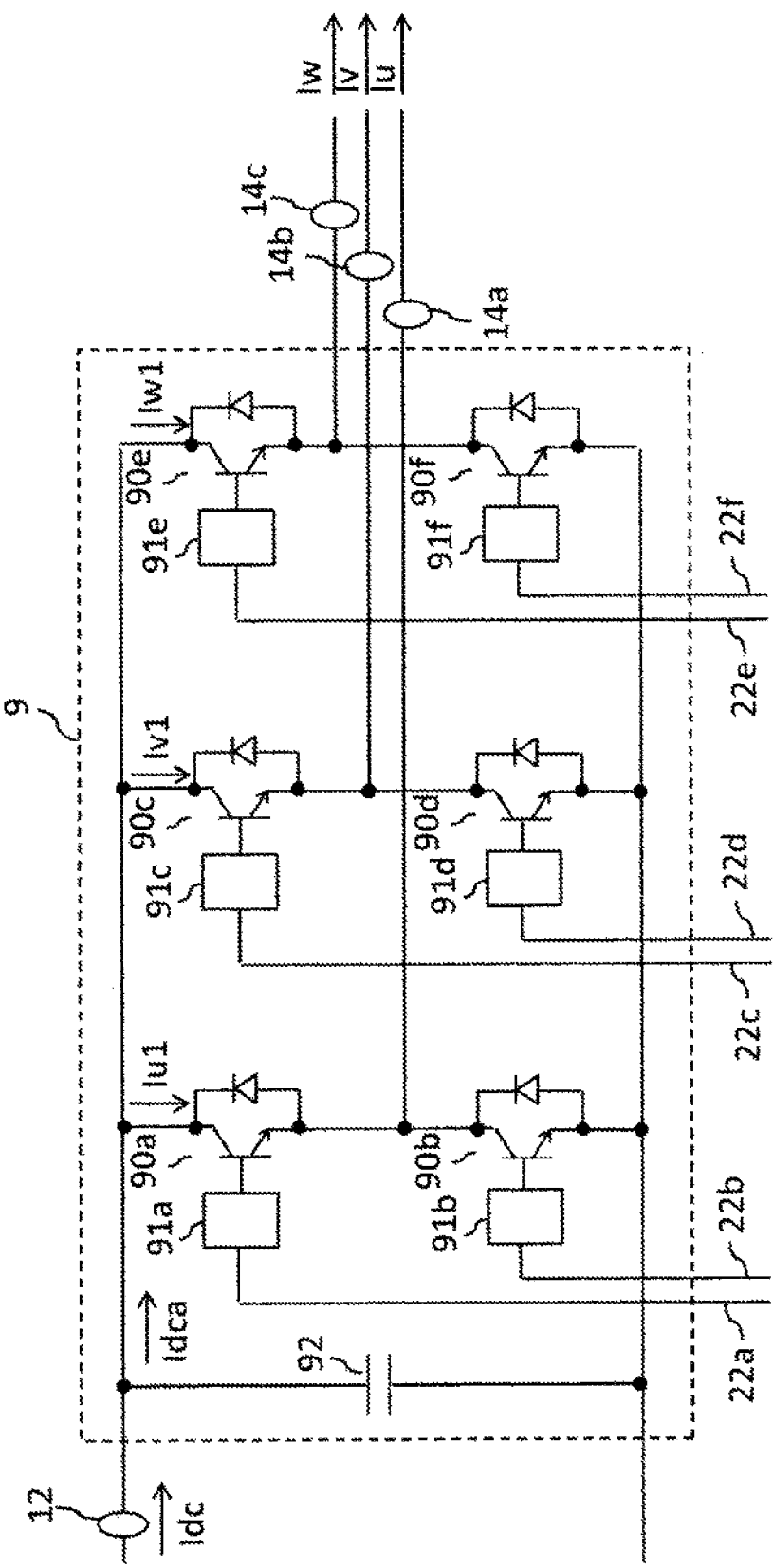
FIG. 2 is a diagram illustrating a configuration example of an inverter circuit in the first embodiment.

As illustrated in FIG. 2, the inverter circuit 9 includes two power semiconductors for each winding (=phase) of the motor 2. The power semiconductor corresponds to, for example, a power metal oxide semiconductor field effect transistor (MOSFET), an insulated gate bipolar transistor (IGBT), or the like. Further, the inverter circuit 9 includes a drive circuit for switching ON/OFF of the power semiconductor for each power semiconductor. Since the motor 2 has three phases, the inverter circuit 9 has a total of six power semiconductors 90a to 90f and six drive circuits 91a to 91f. Note that, in the present embodiment, the upper power semiconductors 90a, 90c, and 90e are collectively referred to as an upper arm, and the lower power semiconductors 90b, 90d, and 90f are collectively referred to as a lower arm. In addition, the inverter circuit 9 includes a smoothing capacitor 92.

The drive circuits 91a to 91f switch ON/OFF of the power semiconductors 90a to 90f on the basis of pulse wide modulation (PWM) signals 22a to 22f output from the inverter control device 16.

The smoothing capacitor 92 is a capacitor for smoothing a current generated by ON/OFF of the power semiconductor and suppressing a ripple of the direct current supplied from the direct current power source 3 to the inverter circuit 9, and corresponds to, for example, an electrolytic capacitor or a film capacitor.

The alternating current sensors 14a to 14c are sensors for measuring alternating currents flowing in phases (a U phase, a V phase, a W phase) of the motor 2. The alternating current sensor 14a measures an alternating current Iu flowing in the U phase, and outputs an alternating current sensor value Ius to the inverter control device 16. Similarly, the alternating current sensor 14b measures an alternating current Iv flowing in the V phase, and outputs an alternating current sensor value Ivs to the inverter control device 16. The alternating current sensor 14c measures an alternating current Iw flowing in the W phase, and outputs an alternating current sensor value Iws to the inverter control device 16.

Note that, in the present embodiment, the alternating current sensors 14a to 14c are installed to measure the current flowing from the inverter circuit 9 into the motor as a positive current value. However, the alternating current sensors 14a to 14c may be installed to measure a reverse current value as the positive current value.

The voltage sensor 10 is a sensor that measures an output voltage of the direct current power source 3, and outputs a measured voltage value to the inverter control device 16 as a voltage sensor value 11.

The direct current sensor 12 is a sensor that measures a direct current Idc flowing between the direct current power source 3 and the inverter circuit 9, and outputs a measured current value to the inverter control device 16 as a direct current sensor value Idcs. Note that, in the present embodiment, the direct current sensor 12 is installed to measure the current flowing from the direct current power source 3 into the inverter circuit 9 as a positive current value. However, the direct current sensor 12 may be installed to measure a reverse current value as the positive current value.

The inverter control device 16 communicates with an electronic control device (not illustrated) outside the power conversion device 1, and receives target torque 5 of the motor 2 from another electronic control device. The inverter control device 16 switches the PWM signals 22a to 22f to control the inverter circuit 9 to drive the motor 2 on the basis of the target torque 5 and the alternating current sensor values Ius, Ivs, and Iws. Further, when the inverter control device 16 determines that a failure has occurred inside the power conversion device 1, the inverter control device 16 outputs an abnormality notification signal 6 to an external abnormality notification device 4.

The inverter control device 16 internally includes a communication circuit (not illustrated), a target current calculation unit 17, a duty calculation unit 19, a PWM signal generation unit 21, a motor speed calculation unit 23, and a direct current sensor diagnostic unit 25.

The target current calculation unit 17 calculates a current value to flow into the motor 2, using the target torque 5, the voltage sensor value 11, and a motor speed value 24 output by the motor speed calculation unit 23, and outputs the current value to the duty calculation unit 19, as a target current value 18. The target current value 18 includes information of a d-axis target current value and a q-axis target current value.

The duty calculation unit 19 calculates a U-phase duty value Du, a V-phase duty value Dv, and a W-phase duty value Dw on the basis of the target current value 18 output by the target current calculation unit 17 and the alternating current sensor values Ius, Ivs, and Iws, and outputs the U-phase duty value Du, the V-phase duty value Dv, and the W-phase duty value Dw to the PWM signal generation unit 21 and the direct current sensor diagnostic unit 25. Du represents an ON time ratio of the power semiconductor 90a, and an ON time ratio of the power semiconductor 90b paired with the power semiconductor 90a is represented by 1-Du. Similarly, Dv represents an ON time ratio of the power semiconductor 90c, and an ON time ratio of the power semiconductor 90d is represented by 1-Dv. Similarly, Dw represents an ON time ratio of the power semiconductor 90e, and an ON time ratio of the power semiconductor 90f is represented by 1-Dw.

The PWM signal generation unit 21 includes a timer (not illustrated), and generates the PWM signals 22a to 22f on the basis of a timer value and the duty values Du, Dv, and Dw, and outputs the PWM signals 22a to 22f to the inverter circuit 9.

Further, the PWM signal generation unit 21 controls the PWM signals 22a to 22f in such a way that the motor 2 is not driven in the case where the abnormality notification signal 6 is output from the direct current sensor diagnostic unit 25. An example of a state in which the motor 2 is not driven includes a state in which all the six power semiconductors in the inverter circuit 9 are turned OFF. Other examples include a state in which the three power semiconductors in the upper arm are turned ON and the three power semiconductors in the lower arm are turned OFF, or in contrast, a case in which the three power semiconductors in the upper arm are turned OFF and the three power semiconductors in the lower arm are turned ON, of the six power semiconductors.

The motor speed calculation unit 23 calculates a motor rotation speed from change of the angle sensor value 7, and outputs a calculated motor speed value 24 to the target current calculation unit 17.

The direct current sensor diagnostic unit 25 is a unit that performs failure diagnosis of the direct current sensor 12, and internally includes an estimated direct current calculation unit 26 and a comparison unit 28. The estimated direct current calculation unit 26 calculates an estimated direct current value Idce1 on the basis of Expression (1) using the duty values Du, Dv, and Dw and the alternating current sensor values Ius, Ivs, and Iws of the phases. The estimated direct current calculation unit 26 outputs the calculated estimated direct current value Idce1 to the comparison unit 28.

[Expression 1]

$$I_{dce1} = D_u \times I_{us} + D_v \times I_{vs} + D_w \times I_{ws} \qquad \text{(Expression 1)}$$

Here, Expression (1) is obtained according to the following idea. In FIG. 2, the direct current Idc flowing in the direct current sensor 12 is an average value of currents Idca between the smoothing capacitor 92 and the power semiconductors. This current Idca is a sum of currents Iu1, Iv1, and Iw1 flowing in the power semiconductors 90a, 90c, and 90e according to Kirchhoff's law. When the power semiconductors 90a, 90c, and 90e are ON, the currents Iu1, Iv1, and Iw1 become equal to alternating current values Iu, Iv, and Iw, respectively. When the power semiconductors 90a, 90c, and 90e are OFF, the currents Iu1, Iv1, and Iw1 are 0. Therefore, average values of the currents Iu1, Iv1, and Iw1 are obtained by multiplying the alternating current values Iu, Iv, and Iw by the ON time ratios of the power semiconductors 90a, 90c, and 90e. Since the ON time ratios of the power semiconductors 90a, 90c, and 90e are the duty values Du, Dv, and Dw, respectively, and the alternating current values Iu, Iv, and Iw can be replaced with the alternating current sensor values Ius, Ivs, and Iws, the direct current Idc can be estimated by calculation of Expression (1).

The comparison unit 28 compares the estimated direct current value Idce1 output from the estimated direct current calculation unit 26 and the direct current sensor value Idcs, and determines whether the direct current sensor 12 is abnormal on the basis of a comparison result. In the case where the comparison unit 28 determines that the direct current sensor 12 is abnormal, the comparison unit 28 outputs the abnormality notification signal 6 to the abnormality notification device 4.

Note that, in the present embodiment, the direct current sensor diagnostic unit 25 is illustrated inside the inverter control device 16. However, the direct current sensor diagnostic unit 25 may be provided outside the inverter control device 16. Further, the direct current sensor diagnostic unit 25 may be mounted in a different electronic control device from the power conversion device 1.

The abnormality notification device 4 receives the abnormality notification signal 6 from the inverter control device 16, and notifies an occupant of occurrence of the abnormality. Examples of a method of notifying the abnormality include a method of lighting a lamp, a method of generating an alarm sound, and a method of giving a notification by voice.

Figure 3:
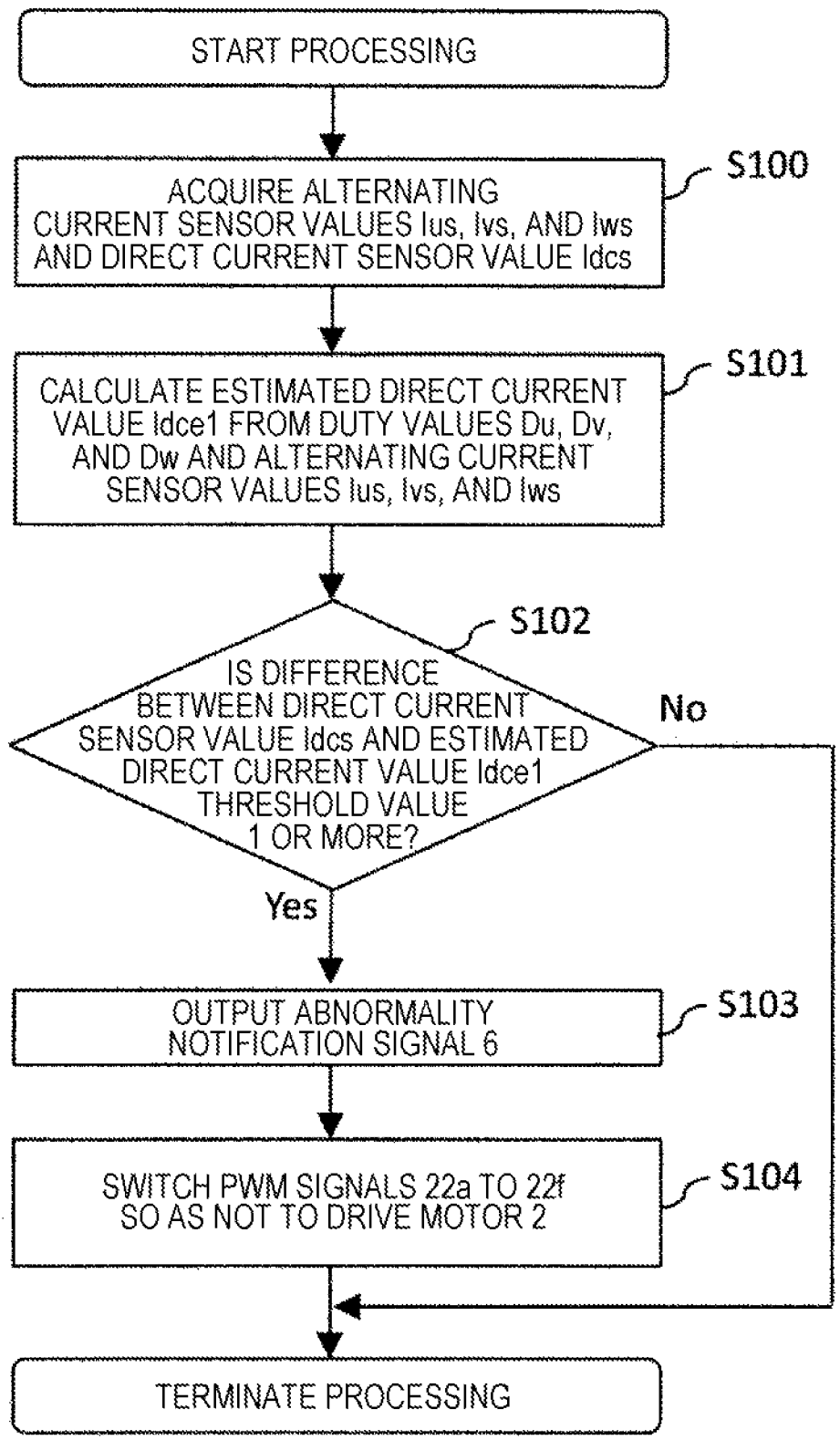
FIG. 3 is a diagram illustrating a flowchart of diagnostic processing of a direct current sensor in the first embodiment.

FIG. 3 is a flowchart illustrating diagnostic processing of the direct current sensor 12 in the first embodiment. This diagnostic processing is executed by the inverter control device 16 at arbitrary timing.

In step S100, the inverter control device 16 acquires the alternating current sensor values Ius, Ivs, and Iws and the direct current sensor value Idcs. Thereafter, in step S101, the estimated direct current calculation unit 26 calculates the estimated direct current value Idce1 on the basis of Expression (1), using the duty values Du, Dv, and Dw and the alternating current sensor values Ius, Ivs, and Iws.

Next, in step S102, the comparison unit 28 compares the direct current sensor value Idcs and the estimated direct current value Idce1, and determines whether a difference between the direct current sensor value Idcs and the estimated direct current value Idce1 is a threshold value 1 or more. In the case where the difference is the threshold value 1 or more, the comparison unit 28 determines that the direct current sensor 12 is abnormal, and proceeds to processing in step S103. In the case where the difference is less than the threshold value 1, the inverter control device 16 terminates the diagnostic processing.

In step S103, the comparison unit 28 outputs the abnormality notification signal 6 to the PWM signal generation unit 21 and the abnormality notification device 4. Thereafter, in step S104, the PWM signal generation unit 21 performs processing of switching the PWM signals 22a to 22f in such a way that the motor 2 is not driven. Thereafter, the inverter control device 16 terminates the diagnostic processing.

Note that the output of the abnormality notification signal 6 to the PWM signal generation unit 21 in step S103 and the control of the PWM signals in step S104 are not indispensable. After the determination that the direct current sensor 12 is abnormal is made, only the output of the abnormality notification signal 6 to the abnormality notification device 4 may be performed.

Further, in the diagnostic processing in FIG. 3, the determination that the direct current sensor 12 is abnormal is made in the case where the difference between the direct current sensor value Idcs and the estimated direct current value Idce1 is the threshold value 1 or more. However, whether the direct current sensor 12 is abnormal may be determined using another criterion. For example, when the difference between the direct current sensor value Idcs and the estimated direct current value Idce1 is larger than a difference of previous diagnosis by a fixed value or more, the determination that the direct current sensor 12 is abnormal can be made.

According to the present embodiment, the estimated direct current calculation unit 26 calculates the estimated direct current value Idce1 on the basis of the alternating current sensor values Ius, Ivs, and Iws and the duty values Du, Dv, and Dw. Then, the comparison unit 28 compares the estimated direct current value Idce1 and the direct current sensor value Idcs, and performs diagnosis of the direct current sensor. Since both the alternating current sensor values Ius, Ivs, and Iws and the direct current sensor value Idcs are changed in conjunction with the operation of the inverter circuit 9, temporal change between the sensors is small. Therefore, the difference between the estimated direct current Idce1 and the direct current sensor value Idcs is small even immediately after the target torque is changed, and the diagnosis of the direct current sensor 12 is constantly possible.

Second Embodiment

In the present embodiment, there is shown an example of a power conversion device capable of constantly diagnosing abnormality of a direct current sensor even in a motor and an inverter circuit having different configurations from the first embodiment.

Figure 4:
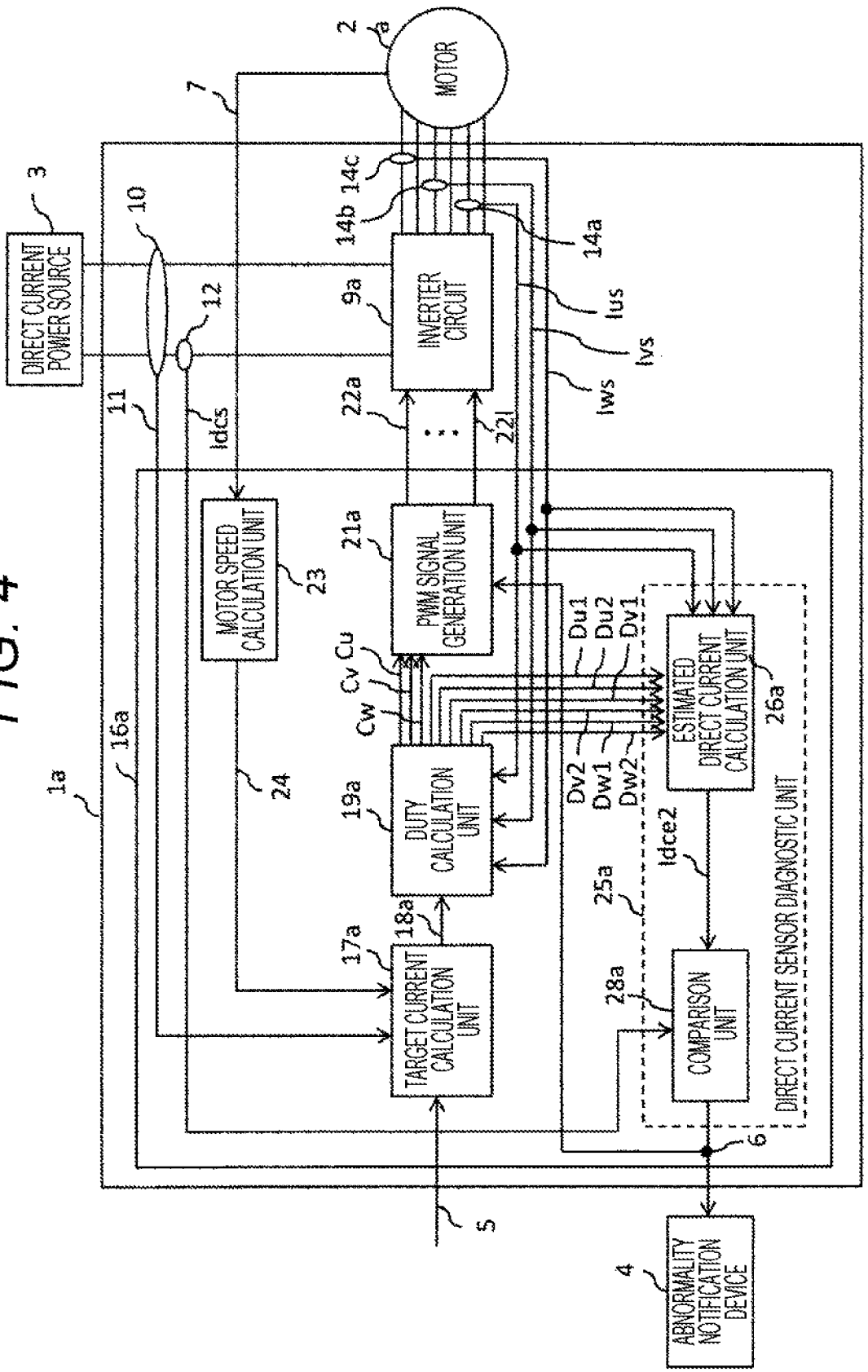
FIG. 4 is a diagram illustrating a configuration example of a power conversion device and a peripheral circuit in a second embodiment.

FIG. 4 illustrates a configuration example of the power conversion device and a peripheral circuit in the second embodiment. Note that the same reference numerals are given to the same elements as in the configuration example in the first embodiment, and the description of the same elements will be omitted.

A motor 2a in the second embodiment is a three-phase six-wire electric motor, which is different from the motor in the first embodiment. Further, a power conversion device 1a in the second embodiment includes an inverter circuit 9a different from that of the first embodiment and an inverter control device 16a different from that of the first embodiment. The number of wires of the inverter circuit 9a and the motor 2a is two for each of a U phase, a V phase and a W phase, which is a total of six. Alternating current sensors 14a to 14c are each installed for one wire of each phase. This is because it is not necessary to measure current values of the two wires of each phase since currents with the same magnitude in opposite directions flow in the two wires of each phase. For this reason, no alternating current sensors are installed in three of the wires of the inverter circuit 9a and the motor 2a. In addition, PWM signals output from the inverter control device 16a to the inverter circuit 9a are also increased to twelve lines.

Figure 5:
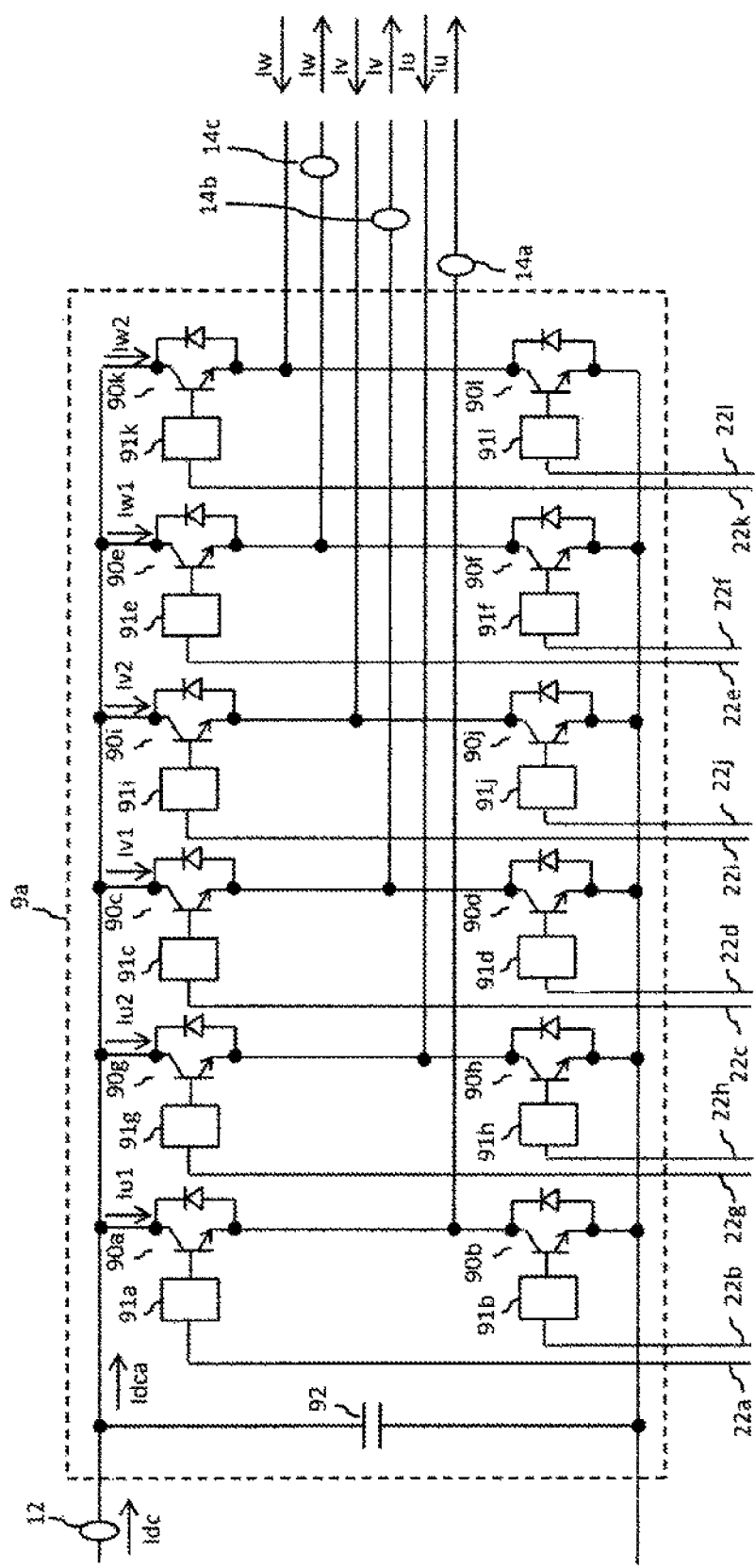
FIG. 5 is a diagram illustrating a configuration example of an inverter circuit in the second embodiment.

FIG. 5 is a diagram illustrating a configuration example of the inverter circuit 9a in the second embodiment. Note that the same reference numerals are given to the same elements as in the configuration example in the first embodiment, and the description of the same elements will be omitted.

Since the motor 2a is a three-phase six-wire electric motor, the inverter circuit 9a internally includes twelve power semiconductors 90a to 90l and twelve drive circuits 91a to 91l. The drive circuits 91a to 91l switch ON/OFF of the power semiconductors 90a to 90l on the basis of PWM signals 22a to 22l output from the inverter control device 16a.

The inverter control device 16a of the second embodiment includes a target current calculation unit 17a, a duty calculation unit 19a, a PWM signal generation unit 21a, and a direct current sensor diagnostic unit 25a, which are different from those of the first embodiment.

The target current calculation unit 17a calculates a current value to flow into the motor 2a, using target torque 5, a voltage sensor value 11, and a motor speed value 24 output by a motor speed calculation unit 23, and outputs the current value to the duty calculation unit 19a, as a target current value 18a. The target current value 18 includes information of a d-axis target current value, a q-axis target current value, and a 0-axis target current value. A 0-axis current refers to a sum of alternating currents of the U phase, V phase, and W phase.

The duty calculation unit 19a calculates PWM signal switching timing information Cu, Cv, and Cw of the U phase, V phase and W phase on the basis of the target current value 18a output by the target current calculation unit 17a and alternating current sensor values Ius, Ivs, and Iws, and outputs the PWM signal switching timing information Cu, Cv, and Cw to the PWM signal generation unit 21a. In the case of the three-phase six-wire system, rising and falling of the PWM signal may occur a plurality of times within one PWM cycle, and thus timing information instead of duty values is output.

Further, the duty calculation unit 19a calculates U-phase duty values Du1 and Du2, V-phase duty values Dv1 and Dv2, and W-phase duty values Dw1 and Dw2, and outputs the U-phase duty values Du1 and Du2, V-phase duty values Dv1 and Dv2, and W-phase duty values Dw1 and Dw2 to the direct current sensor diagnostic unit 25a. Du1 represents an ON time ratio of a power semiconductor 90a, and an ON time ratio of a power semiconductor 90b paired with the power semiconductor 90a is represented by 1-Du1. Further, Du2 represents an ON time ratio of a power semiconductor 90g, and an ON time ratio of a power semiconductor 90h paired with the power semiconductor 90g is represented by 1-Du2. Similarly, Dv1 represents an ON time ratio of a power semiconductor 90c, and Dv2 represents an ON time ratio of a power semiconductor 90*i*. Dw1 represents an ON time ratio of a power semiconductor 90*e*, and Dw2 represents an ON time ratio of a power semiconductor 90*k*.

The PWM signal generation unit 21*a* generates the PWM signals 22*a* to 22*l* on the basis of an internal timer value and the PWM signal switching timing information Cu, Cv, and Cw output from the duty calculation unit 19*a*, and outputs the PWM signals 22*a* to 22*l* to the inverter circuit 9*a*.

Further, the PWM signal generation unit 21*a* controls the PWM signals 22*a* to 22*l* in such a way that the motor 2*a* is not driven in the case where an abnormality notification signal 6 is output from the direct current sensor diagnostic unit 25*a*. An example of a state in which the motor 2*a* is not driven includes a state in which all the twelve power semiconductors in the inverter circuit 9*a* are turned OFF. Other examples include a state in which the six power semiconductors in an upper arm are turned ON and the six power semiconductors in a lower arm are turned OFF, or in contrast, a case in which the six power semiconductors in the upper arm are turned OFF and the six power semiconductors in the lower arm are turned ON, of the twelve power semiconductors.

The direct current sensor diagnostic unit 25*a* includes an estimated direct current value calculation unit 26*a* and a comparison unit 28*a*, which are different from the first embodiment.

The estimated direct current value calculation unit 26*a* calculates an estimated direct current value Idce2 on the basis of Expression (2) using the duty values Du1, Du2, Dv1, Dv2, Dw1, and Dw2 calculated by the duty calculation unit 19*a* and the alternating current sensor values Ius, Ivs, and Iws. The estimated direct current calculation unit 26*a* outputs the calculated estimated direct current value 27*a* to the comparison unit 28*a*.

[Expression 2]

$$I_{dce2}=(D_{u1}-D_{u2})\times I_{us}+(D_{v1}-D_{v2})\times I_{vs}+(D_{w1}-D_{w2})\times I_{ws} \quad \text{(Expression 2)}$$

Here, Expression (2) is obtained by the following idea. In FIG. 5, a direct current Idc flowing in a direct current sensor 12 is an average value of currents Idca between a smoothing capacitor 92 and the power semiconductors. This current Idca is a sum of currents Iu1, Iu2, Iv1, Iv2, Iw1, and Iw2 flowing in the power semiconductors 90*a*, 90*g*, 90*c*, 90*i*, 90*e*, and 90*k* according to Kirchhoff's law. When the power semiconductors 90*a*, 90*c*, and 90*e* are ON, the currents Iu1, Iv1, and Iw1 become equal to alternating current values Iu, Iv, and Iw, respectively. When the power semiconductors 90*a*, 90*c*, and 90*e* are OFF, the currents Iu1, Iv1, and Iw1 are 0. Further, when the power semiconductors 90*g*, 90*i* and 90*k* are ON, the currents Iu2, Iv2, and Iw2 are equal to −Iu, −Iv and −Iw, respectively. When the power semiconductors 90*g*, 90*i*, and 90*k* are OFF, the currents Iu2, Iv2, and Iw2 are 0. Thus, average values of the currents Iu1, Iv1, and Iw1 are obtained by multiplying the alternating current values Iu, Iv, and Iw by the ON time ratios of the power semiconductors 90*a*, 90*c*, and 90*e*. Further, average values of the currents Iu2, Iv2, and Iw2 are obtained by multiplying −Iu, −Iv, and −Iw by the ON time ratios of the power semiconductors 90*g*, 90*i*, and 90*k*. The ON time ratios of the power semiconductors 90*a*, 90*c* and 90*e* are the duty values Du1, Dv1 and Dw1, respectively, and the ON time ratios of the power semiconductors 90*g*, 90*i* and 90*k* are Du2, Dv2 and Dw2, respectively. Since the alternating current values Iu, Iv, and Iw can be replaced with the alternating current sensor values Ius, Ivs, and Iws, the direct current Idc can be estimated by calculation of Expression (2) in the case of the three-phase six-wire system.

The comparison unit 28*a* compares the estimated direct current value Idce2 output from the estimated direct current calculation unit 26*a* and a direct current sensor value Idcs, and determines whether the direct current sensor 12 is abnormal on the basis of a comparison result. In the case where the comparison unit 28*a* determines that the direct current sensor 12 is abnormal, the comparison unit 28*a* outputs an abnormality notification signal 6 to an abnormality notification device 4.

Note that, in the present embodiment, the direct current sensor diagnostic unit 25*a* is illustrated inside the inverter control device 16*a*. However, the direct current sensor diagnostic unit 25*a* may be provided outside the inverter control device 16*a*. Further, the direct current sensor diagnostic unit 25*a* may be mounted in a different electronic control device from the power conversion device 1*a*.

Figure 6:
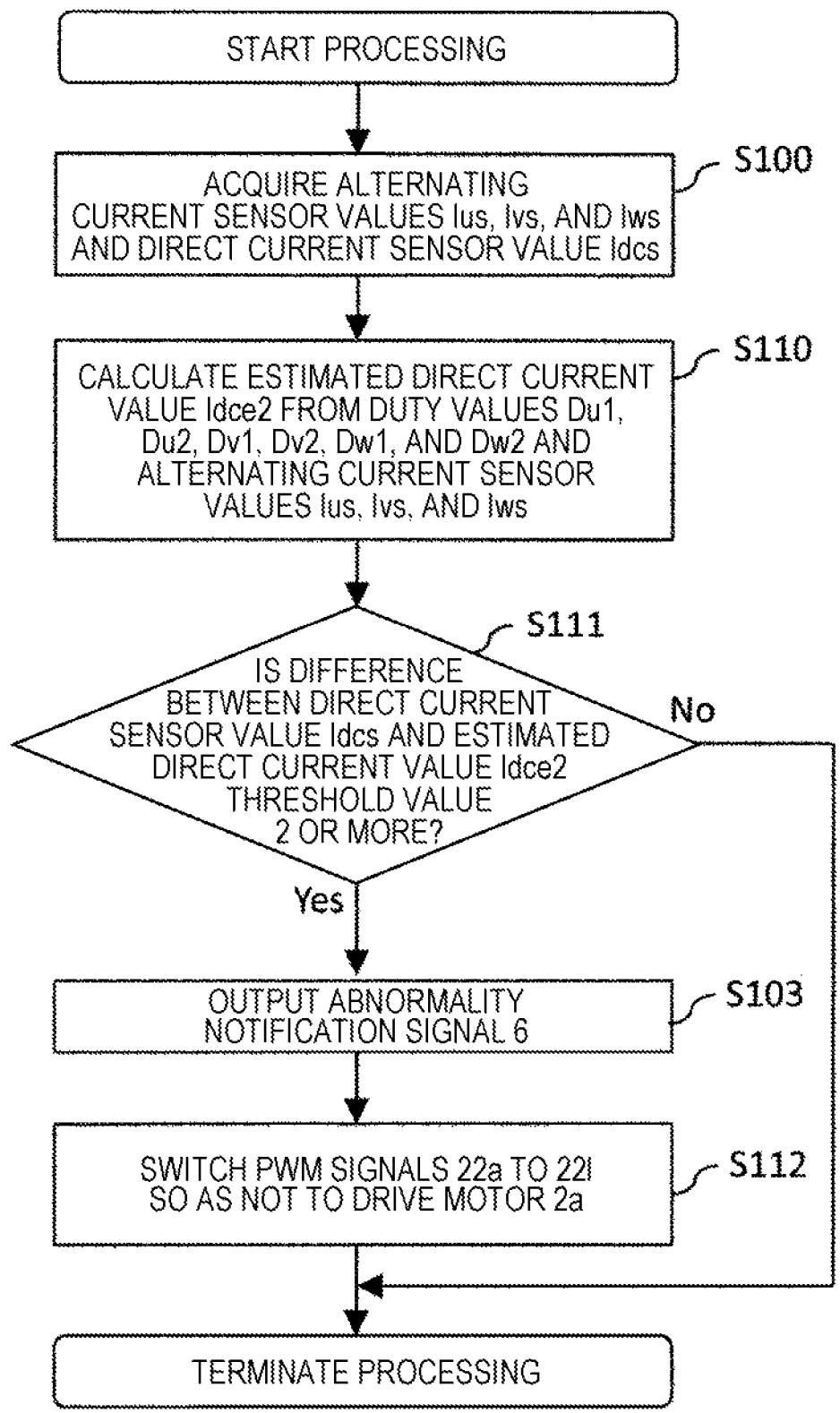
FIG. 6 is a diagram illustrating a flowchart of diagnostic processing of a direct current sensor in the second embodiment.

FIG. 6 is a flowchart illustrating diagnostic processing of the direct current sensor 12 in the second embodiment. This diagnostic processing is executed by the inverter control device 16*a* at arbitrary timing. Note that the same reference numerals are given to parts that perform the same processing as the diagnostic processing in the first embodiment, and the description thereof will be omitted.

In the diagnostic processing in FIG. 6, processing in step S110 is performed instead of the processing in step S101 of the first embodiment. Further, processing in step S111 is performed instead of the processing in step S102 of the first embodiment. In addition, processing in step S112 is performed instead of the processing in step S104.

In step S110, the estimated direct current calculation unit 26*a* calculates the estimated direct current value Idce2 on the basis of Expression (2), using the duty values Du1, Du2, Dv1, Dv2, Dw1, and Dw2 and the alternating current sensor values Ius, Ivs, and Iws.

Next, in step S111, the comparison unit 28*a* compares the direct current sensor value Idcs and the estimated direct current value Idce2, and determines whether a difference between the direct current sensor value Idcs and the estimated direct current value Idce2 is a threshold value 2 or more. In the case where the difference is the threshold value 2 or more, the comparison unit 28*a* determines that the direct current sensor 12 is abnormal, and proceeds to processing in step S103. In the case where the difference is less than the threshold value 2, the inverter control device 16*a* terminates the diagnostic processing.

In step S112, the PWM signal generation unit 21*a* controls the PWM signals 22*a* to 22*l* in such a way that the motor 2*a* is not driven.

Note that the output of the abnormality notification signal 6 to the PWM signal generation unit 21*a* in step S103 and the control of the PWM signals in step S112 are not indispensable. After the determination that the direct current sensor 12 is abnormal is made, only the output of the abnormality notification signal 6 to the abnormality notification device 4 may be performed.

Further, in the diagnostic processing in FIG. 6, the determination that the direct current sensor 12 is abnormal is made in the case where the difference between the direct current sensor value Idcs and the estimated direct current value Idce2 is the threshold value 2 or more. However, whether the direct current sensor 12 is abnormal may be determined using another criterion. For example, when the difference between the direct current sensor value Idcs and the estimated direct current value Idce2 is larger than a difference of previous diagnosis by a fixed value or more, the determination that the direct current sensor 12 is abnormal can be made.

As described above, according to the present embodiment, even in the case where the motor 2a and the inverter circuit 9a are of the three-phase six-wire system, the estimated direct current value Idce2 is calculated on the basis of the alternating current sensor values Ius, Ivs, and Iws and the duty values Du1, Du2, Dv1, Dv2, Dw1, and Dw2, and diagnosis of the direct current sensor 12 can be constantly performed on the basis of the estimated direct current value Idce2 and the direct current sensor value Idcs.

Note that, in the present embodiment, the estimated direct current value Idce2 has been calculated using the duty values Du1, Du2, Dv1, Dv2, Dw1, and Dw2. However, the estimated direct current value Idce2 may be calculated using the PWM signal switching timing information Cu, Cv, and Cw instead of the duty values.

Third Embodiment

In the present embodiment, an example of a power conversion device with improved diagnostic accuracy in addition to capability of constantly diagnosing abnormality of a direct current sensor will be described.

Figure 7:
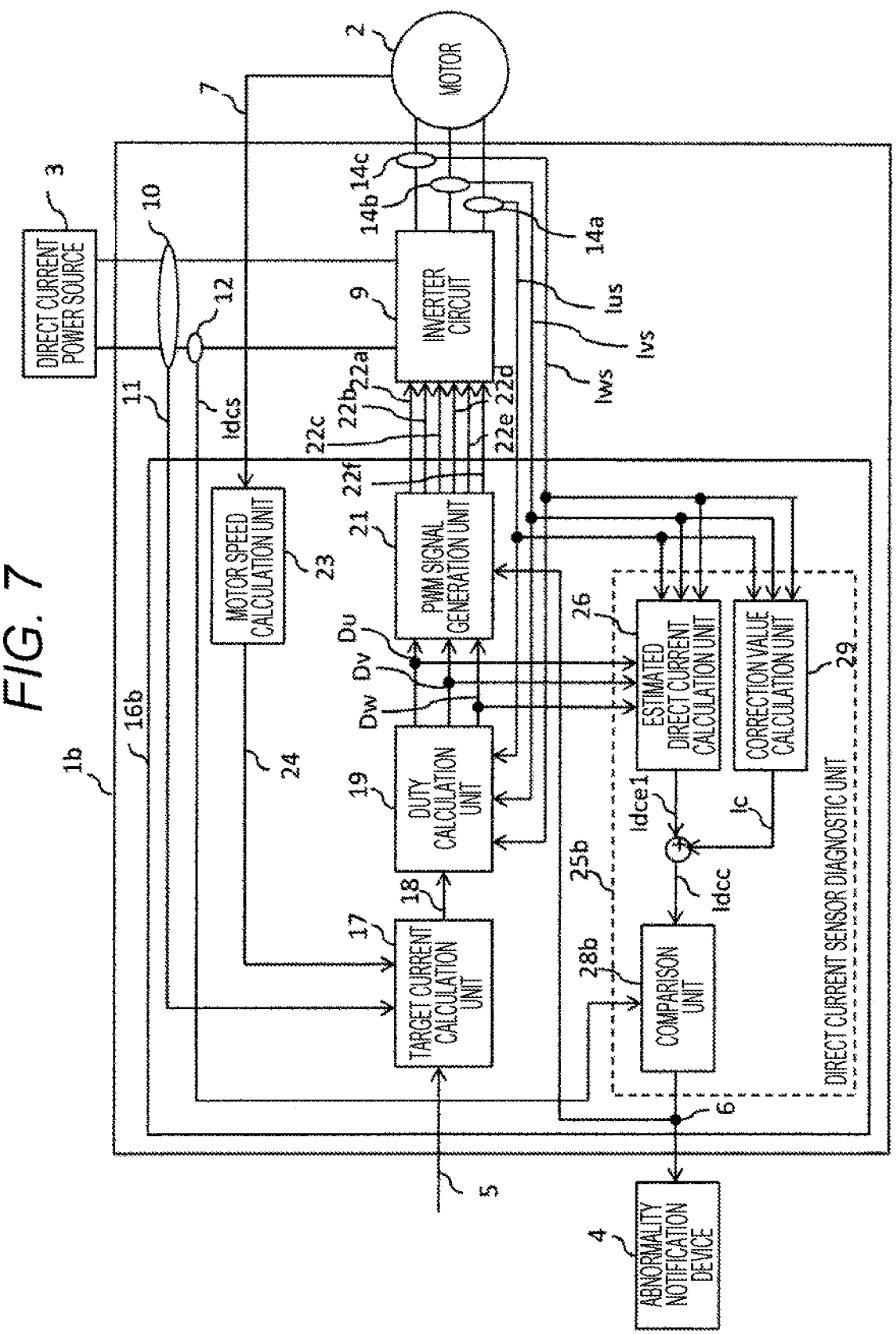
FIG. 7 is a diagram illustrating a configuration example of a power conversion device and a peripheral circuit in a third embodiment.

FIG. 7 is a diagram illustrating a configuration example of a power conversion device and a peripheral circuit in the third embodiment. Note that the same reference numerals are given to the same elements as in the configuration example in the first embodiment, and the description of the same elements will be omitted.

A power conversion device 1b in the third embodiment includes an inverter control device 16b different from that of the first embodiment. The inverter control device 16b includes a direct current sensor diagnostic unit 25b different from the direct current sensor diagnostic unit 25 in the first embodiment.

The direct current sensor diagnostic unit 25b includes a correction value calculation unit 29 in addition to the configuration of the direct current sensor diagnostic unit 25 in the first embodiment. Further, the direct current sensor diagnostic unit 25b includes a comparison unit 28b different from the comparison unit 28 in the first embodiment. In addition, a function to add a correction value Ic output by the correction value calculation unit 29 to an estimated direct current value Idce1 to calculate an estimated direct current value after correction Idcc is added to the direct current sensor diagnostic unit 25b.

The comparison unit 28b compares the direct current sensor value Idcs and the estimated direct current value after correction Idcc instead of the estimated direct current value Idce1, and determines whether a direct current sensor 12 is abnormal from a comparison result.

The correction value calculation unit 29 calculates a correction value 30 according to Expression (3), using alternating current sensor values Ius, Ivs, and Iws. In Expression (3), K represents a correction coefficient, and a value larger than 0 and less than 1 is used as the correction coefficient. Note that, when K is set to 0.5, an error held by the estimated direct current value after correction Idcc can be reduced most. The reason will be described in the section of the effect example to be described below.

[Expression 3]

$$I_c = -K \times (I_{us} + I_{vs} + I_{ws}) \quad \text{(Expression 3)}$$

Figure 8:
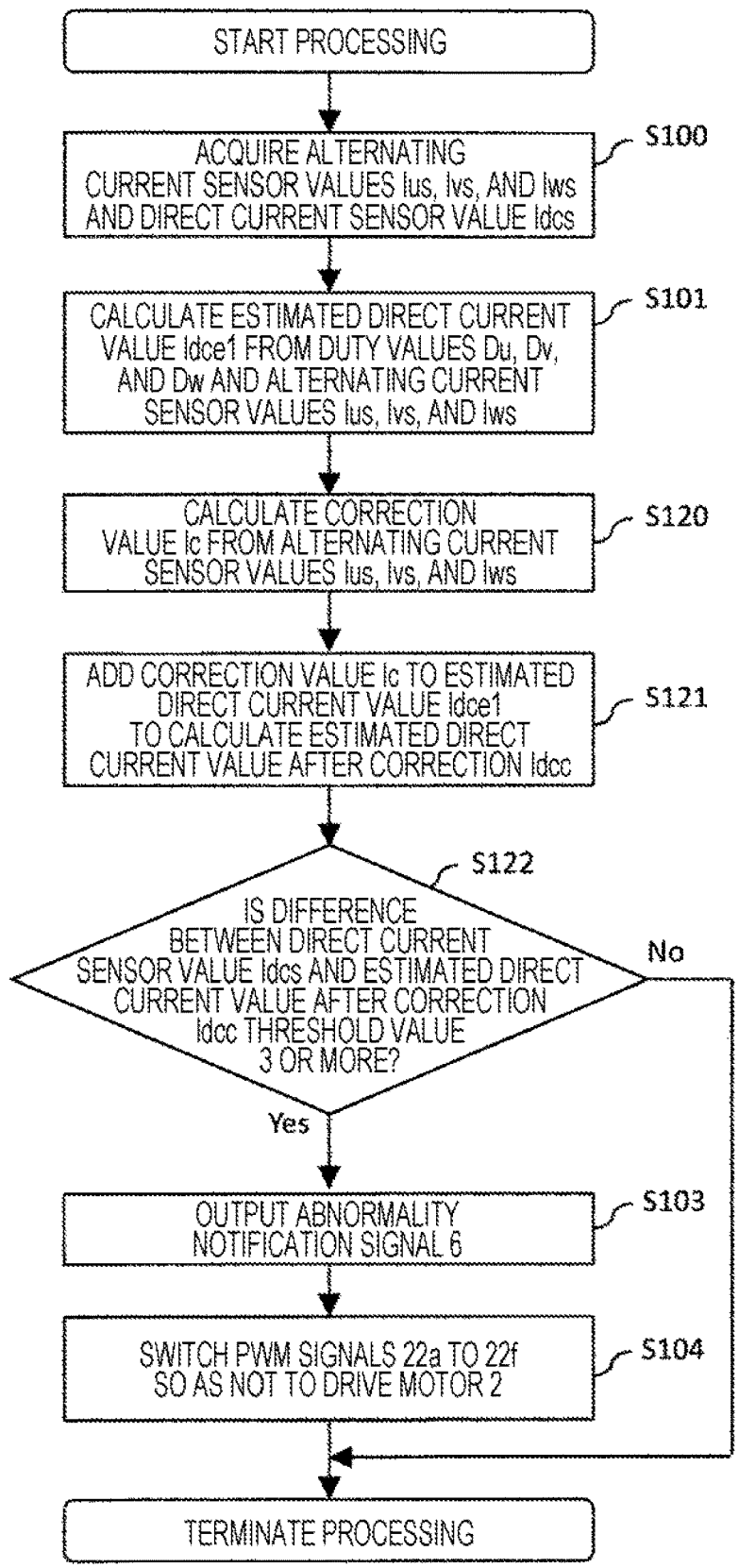
FIG. 8 is a diagram illustrating a flowchart of diagnostic processing of a direct current sensor in the third embodiment.

Note that, in the present embodiment, the direct current sensor diagnostic unit 25b is illustrated inside the inverter control device 16b. However, the direct current sensor diagnostic unit 25b may be provided outside the inverter control device 16b. In addition, the direct current sensor diagnostic unit 25b may be mounted in a different electronic control device from the power conversion device 1b. FIG. 8 is a flowchart illustrating diagnostic processing of the direct current sensor 12 in the third embodiment. This diagnostic processing is executed by the inverter control device 16b at arbitrary timing. Note that the same reference numerals are given to parts that perform the same processing as the diagnostic processing in the first embodiment, and the description thereof will be omitted.

In the diagnostic processing in FIG. 8, steps S120 and S121 are added to the diagnostic processing of the first embodiment. In addition, processing in step S122 is performed instead of step S102 of the first embodiment.

In step S120, the correction value calculation unit calculates a correction value Ic on the basis of Expression (3), using the alternating current sensor values Ius, Ivs, and Iws. Thereafter, in step S121, the direct current sensor diagnostic unit 25b adds the estimated direct current value Idce1 and the correction value Ic to calculate the estimated direct current value after correction Idcc.

Next, in step S122, the comparison unit 28b compares the direct current sensor value Idcs and the estimated direct current value after correction Idcc, and determines whether a difference between the direct current sensor value Idcs and the estimated direct current value after correction Idcc is a threshold value 3 or more. In the case where the difference is the threshold value 3 or more, the comparison unit 28b determines that the direct current sensor 12 is abnormal, and proceeds to processing in step S103. In the case where the difference is less than the threshold value 3, the inverter control device 16b terminates the diagnostic processing.

Further, in the diagnostic processing in FIG. 8, the determination that the direct current sensor 12 is abnormal is made in the case where the difference between the direct current sensor value Idcs and the estimated direct current value after correction Idcc is the threshold value 3 or more. However, whether the direct current sensor 12 is abnormal may be determined using another criterion. For example, when the difference between the direct current sensor value Idcs and the estimated direct current value after correction Idcc is larger than a difference of previous diagnosis by a fixed value or more, the determination that the direct current sensor 12 is abnormal can be made.

Figure 9:
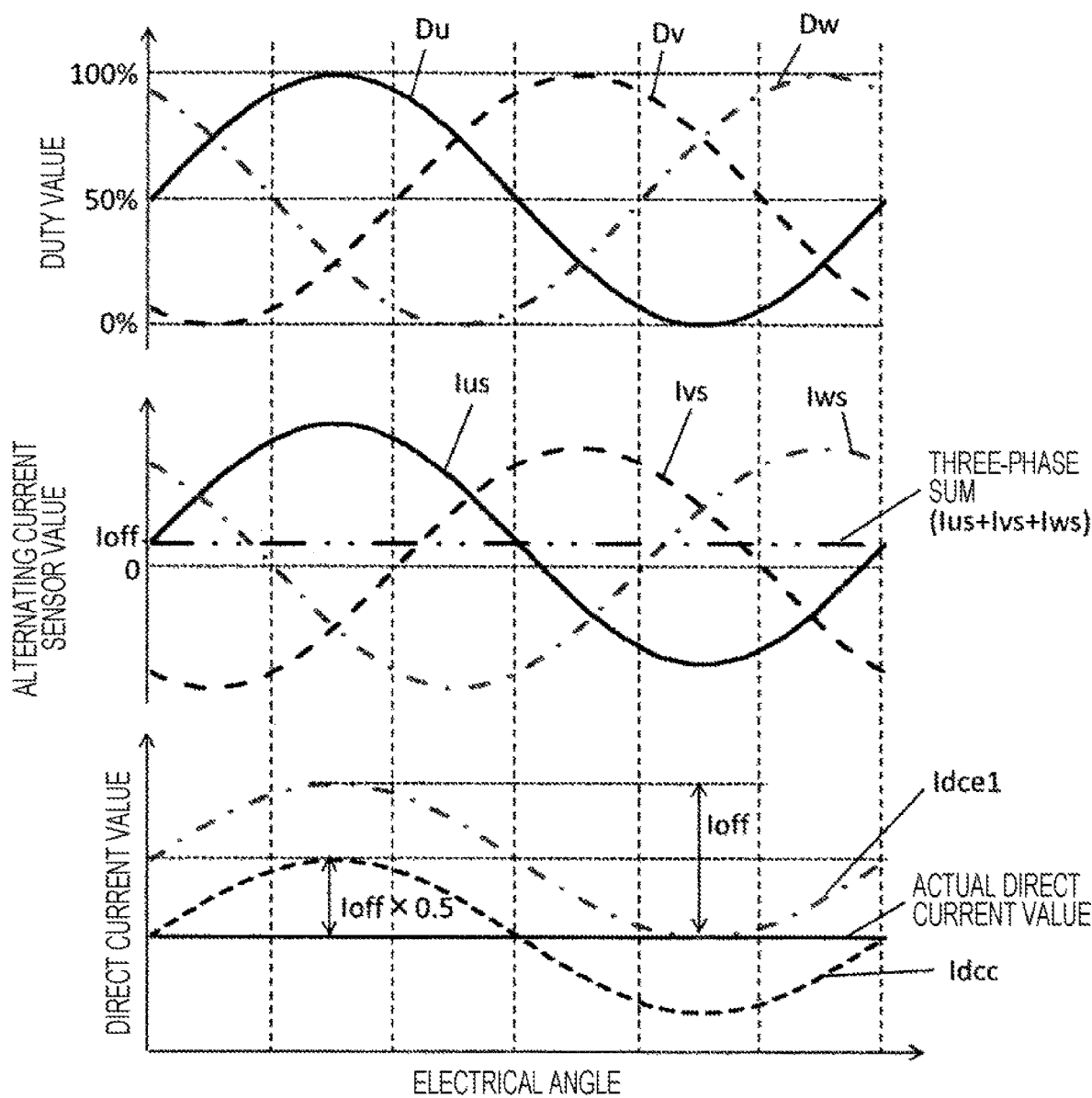
FIG. 9 is a diagram illustrating an example of a correction effect in a state in which a U-phase alternating current sensor value Ius has an offset error Ioff.

FIG. 9 is an example illustrating an effect by correction in the case where the U-phase alternating current sensor value Ius includes an offset error Ioff. The upper graph in FIG. 9 illustrates the duty values Du, Dv, and Dw of the U phase, V phase, and W phase, and the middle graph illustrates the alternating current sensor values Ius, Ivs, and Iws of the U phase, V phase, and W phase, and a value of a three-phase sum of the alternating current sensor values. The lower graph illustrates an actual direct current value, an estimated direct current value Idce1 before correction, and the estimated direct current value after correction Idcc. The correction value Ic is calculated on the basis of Expression (3), and the correction coefficient K is 0.5 in FIG. 9. Further, the horizontal axes represent an electrical angle of the motor 2.

In FIG. 9, the actual direct current value exhibits a fixed value. In contrast, since the U-phase alternating current sensor value Ius has the offset error Ioff, an error of up to Ioff occurs in the estimated direct current value Idce1, as compared with the actual direct current value. Further, in the case of taking an average value of the estimated direct current values Idce1 in one cycle of the electrical angle, an average value of the estimated direct current values Idce1 has an error of Ioff×0.5, as compared with the actual direct current value. In contrast, an error between the estimated direct current value after correction Idcc and the actual direct current value is decreased to Ioff×0.5. Further, an average of the estimated direct current values after correction Idcc is equal to the actual direct current value.

FIG. 10 illustrates an amount of error held by the estimated direct current value after correction Idcc in the case where the value of the correction coefficient K is changed in the example in FIG. 9. In the example in FIG. 9, the three-phase sum of the alternating current sensor values Ius, Ivs, and Iws becomes Ioff. Therefore, the correction value Ic is increased by −0.1×Ioff as the correction coefficient K is increased by 0.1. As a result, the estimated direct current value after correction Idcc is decreased by 0.1×Ioff.

From FIG. 10, when the correction coefficient K becomes 1, the amount of error held by the estimated direct current value after correction Idcc becomes the same value as that in a case where the correction coefficient K is 0 (=no correction). Further, when the correction coefficient K is 0.5, the amount of error of the estimated direct current value after correction Idcc becomes smallest.

Figure 11:
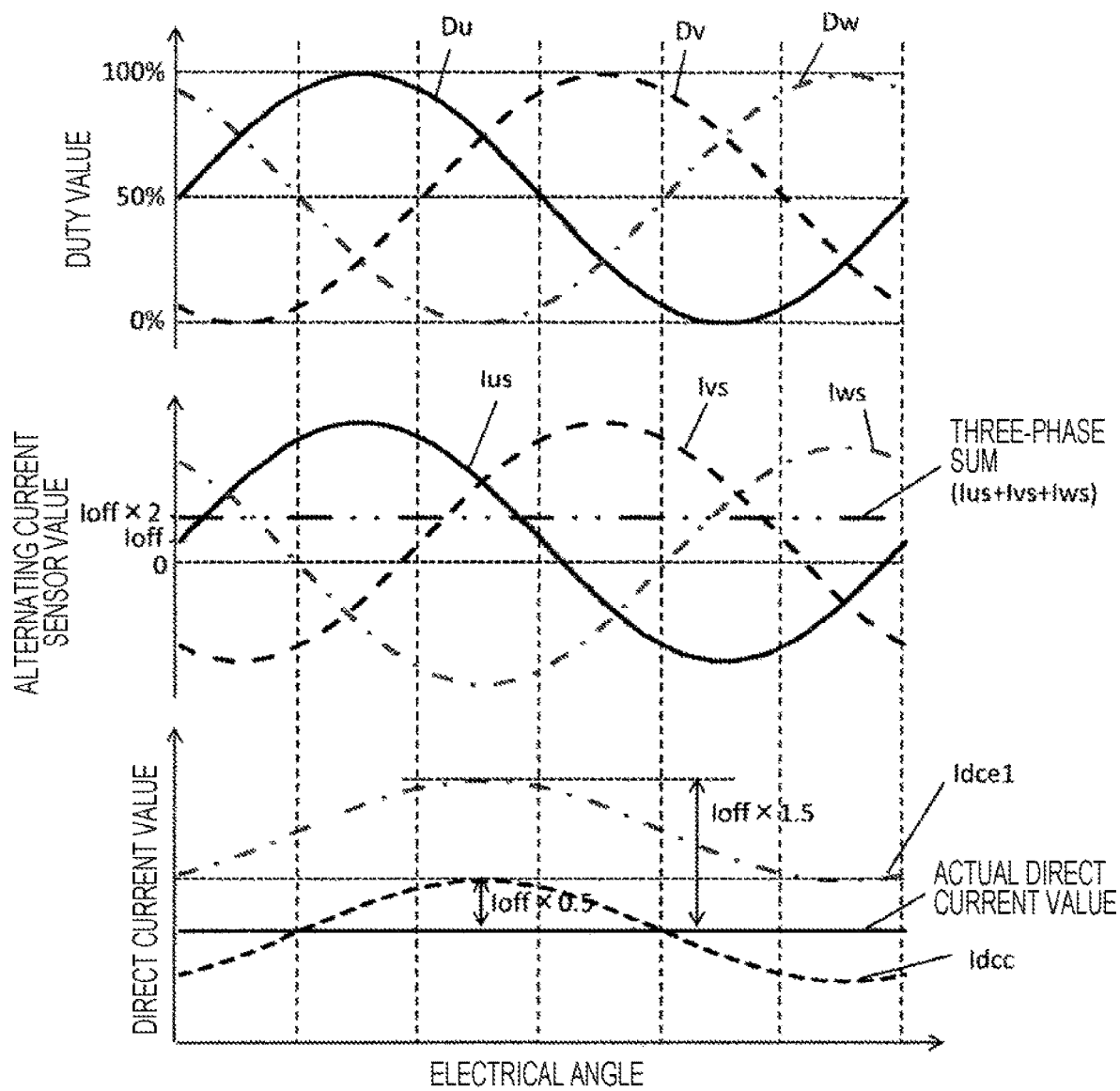
FIG. 11 is a diagram illustrating an example of a correction effect in a state in which a U-phase alternating current sensor value Ius and a V-phase alternating current sensor value Ivs have an offset error Ioff.

FIG. 11 is an example illustrating an effect by correction in the case where the U-phase alternating current sensor value Ius and the V-phase alternating current sensor value Ivs have the offset error Ioff. The arrangement of the graphs in FIG. 11 is similar to that in FIG. 9, and the value of the correction coefficient K in FIG. 11 is 0.5.

In FIG. 11, an error of up to Ioff×1.5 occurs in the estimated direct current value Idce1, as compared with the actual direct current value. Further, in the case of taking an average value of the estimated direct current values Idce1 in one cycle of the electrical angle, an average value of the estimated direct current values Idce1 has an error of Ioff, as compared with the actual direct current value. In contrast, an error between the estimated direct current value after correction Idcc and the actual direct current value is decreased to Ioff×0.5. Further, an average of the estimated direct current values after correction Idcc is equal to the actual direct current value.

FIG. 12 illustrates an amount of error held by the estimated direct current value after correction Idcc in the case where the value of the correction coefficient K is changed in the example in FIG. 11. In the example in FIG. 11, the three-phase sum of the alternating current sensor values Ius, Ivs, and Iws becomes Ioff×2. Therefore, the correction value Ic is increased by −0.2×Ioff as the correction coefficient K is increased by 0.1. As a result, the estimated direct current value after correction Idcc is decreased by 0.2×Ioff.

In the example in FIG. 11, when the correction coefficient K becomes 1, the amount of error becomes the same as that in the case where the correction coefficient K is 0. Further, when the correction coefficient K is 0.5, the amount of error of the estimated direct current value after correction Idcc becomes smallest.

Figure 13:
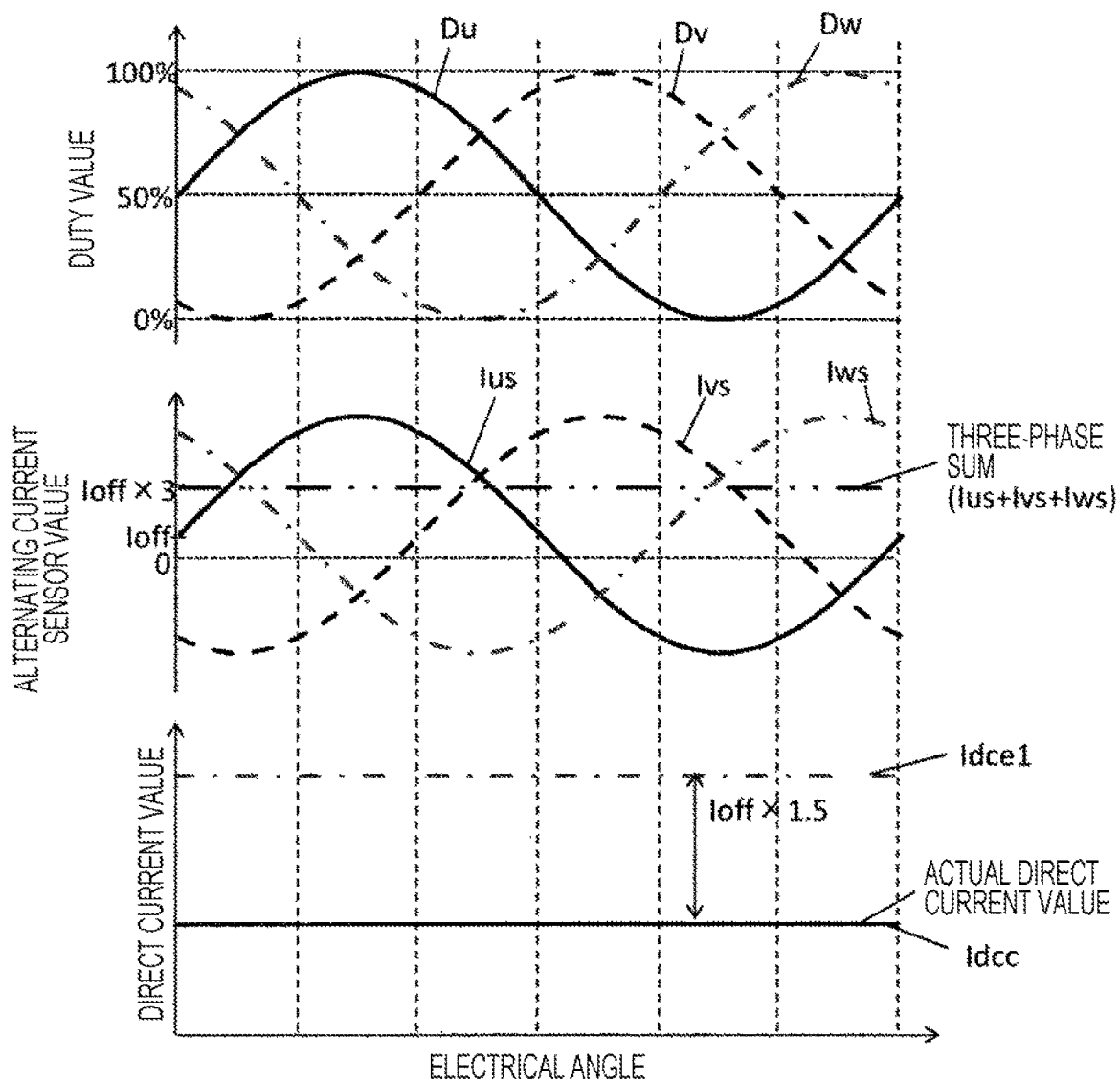
FIG. 13 is a diagram illustrating an example of a correction effect in a state in which a U-phase alternating current sensor value Ius and a V-phase alternating current sensor value Ivs have an offset error Ioff.

FIG. 13 is an example illustrating an effect by correction in the case where the U-phase alternating current sensor value Ius, the V-phase alternating current sensor value Ivs, and the W-phase alternating current sensor value Iws have the offset error Ioff. The arrangement of the graphs in FIG. 13 is similar to that in FIG. 9, and the value of the correction coefficient K in FIG. 13 is 0.5.

In the example in FIG. 13, the estimated direct current value Idce1 constantly has an error of Ioff×1.5, regardless of the electrical angle, as compared with the actual direct current value. In contrast, the estimated direct current value after correction Idcc becomes equal to the actual direct current value.

FIG. 14 illustrates an amount of error held by the estimated direct current value after correction Idcc in the case where the value of the correction coefficient K is changed in the example in FIG. 13. In the example in FIG. 13, the three-phase sum of the alternating current sensor values Ius, Ivs, and Iws becomes Ioff×3. Therefore, the correction value Ic is increased by −0.3×Ioff as the correction coefficient K is increased by 0.1. As a result, the estimated direct current value after correction Idcc is decreased by 0.3×Ioff.

In the example in FIG. 13, when the correction coefficient K becomes 1, the amount of error becomes the same as that in the case where the correction coefficient K is 0. Further, when the correction coefficient K is 0.5, the amount of error of the estimated direct current value after correction Idcc becomes smallest.

Figure 15:
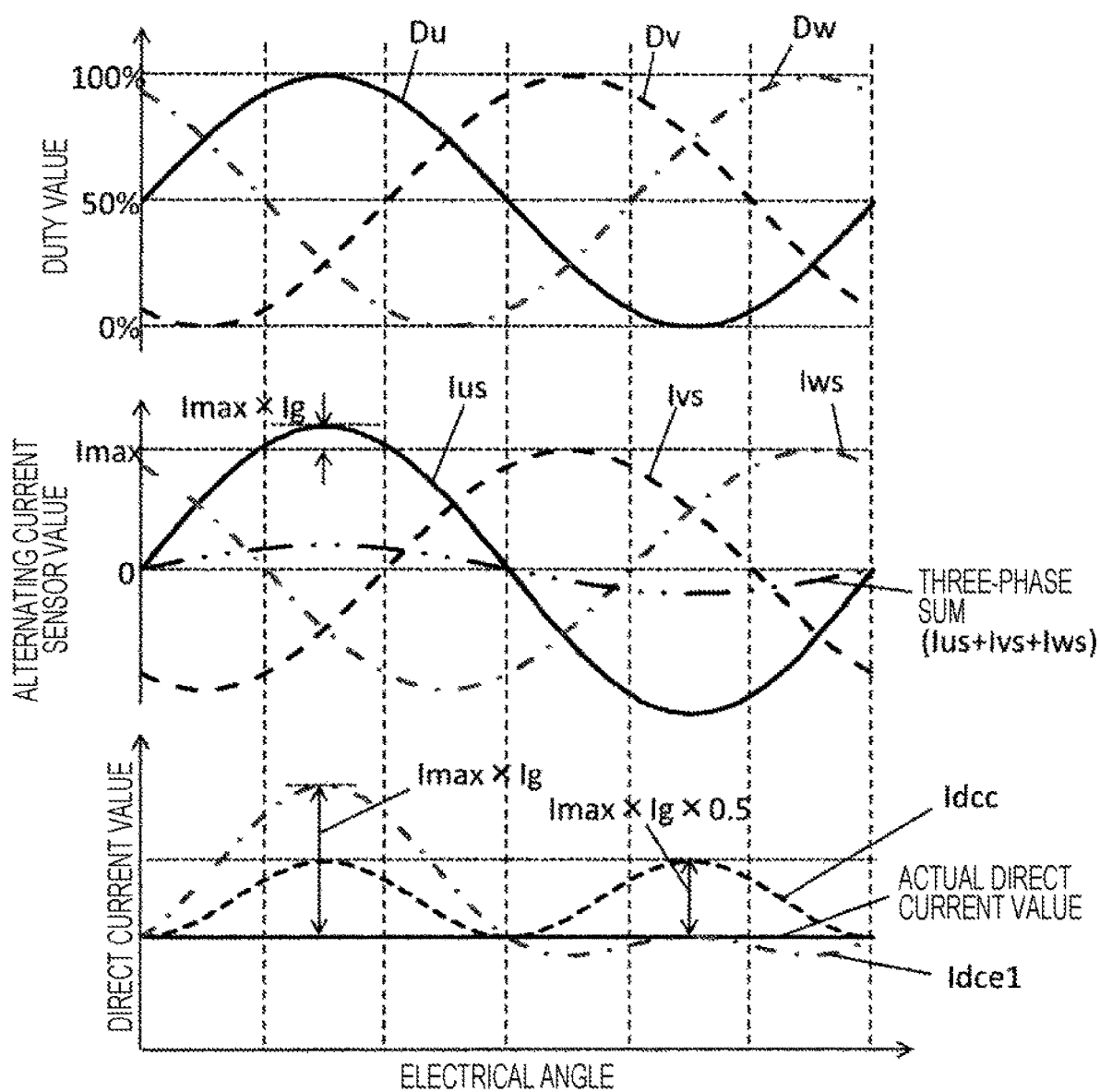
FIG. 15 is a diagram illustrating an example of a correction effect in a state in which a U-phase alternating current sensor value Ius has a gain error Ig.

FIG. 15 is an example illustrating an effect by correction in the case where the U-phase alternating current sensor value has a gain error Ig. The arrangement of the graphs in FIG. 15 is similar to that in FIG. 9, and the value of the correction coefficient K in FIG. 15 is 0.5. Since the U-phase alternating current sensor has the gain error Ig, the value of Ius in the middle graph is increased by Iu×Ig when a primary U-phase alternating current value is Iu. In this example, since a maximum value of the primary U-phase alternating current value is Imax, a maximum error value of Ius is Imax×Ig.

In the example in FIG. 15, an error of up to Imax×Ig occurs in the estimated direct current value Idce1, as compared with the actual direct current value. Further, in the case of taking an average value of the estimated direct current values Idce1 in one cycle of the electrical angle, an average value of the estimated direct current values Idce1 has an error of Imax×Ig×0.25, as compared with the actual direct current value. In contrast, an error between the estimated direct current value after correction Idcc and the actual direct current value is decreased to Imax×Ig×0.5. However, an average value of the estimated direct current values after correction Idcc becomes the same value as an average value of the estimated direct current values Idce1 before correction, and an error of the average value is not decreased.

FIG. 16 illustrates an amount of error held by the estimated direct current value after correction Idcc in the case where the value of the correction coefficient K is changed in the example in FIG. 15. In the example in FIG. 15, the three-phase sum of the alternating current sensor values Ius, Ivs, and Iws becomes Iu×Ig. Therefore, the correction value Ic is increased by −0.1×Iu×Ig as the correction coefficient K is increased by 0.1.

In the example in FIG. 15, when the correction coefficient K becomes 1, the amount of error becomes the same as that in the case where the correction coefficient K is 0. Further, when the correction coefficient K is 0.5, the amount of error of the estimated direct current value after correction Idcc becomes smallest. Note that the error held by the average value of the estimated direct current values after correction Idcc is constant regardless of the value of the correction coefficient K.

As described above, according to the present embodiment, the correction value calculation unit 29 calculates the correction value Ic using the alternating current sensor values Ius, Ivs, and Iws, and the comparison unit compares the estimated direct current value after correction Idcc and the direct current sensor value Idcs to perform diagnosis. Since the deviation of the estimated direct current value Idce1 caused by the error held by alternating current sensor values 14a to 14c can be decreased by the correction value Ic, the abnormality detection threshold value 3 in the present embodiment can be set to be smaller than the threshold value 1 of the first embodiment. As a result, in the case where the direct current sensor value Idcs deviates from the primary value, abnormality can be detected even in a case of a small deviation, and the diagnosis of the direct current sensor 12 can be more accurately performed.

Further, from the example illustrated in FIGS. 9 to 16, the error from the actual direct current value can be further reduced by taking the average of the estimated direct current values after correction Idcc. Therefore, the diagnosis of the direct current sensor 12 may be performed by averaging the estimated direct current values after correction Idcc, using a low-pass filter or the like, and using an averaged estimated direct current value after correction and the direct current sensor value Idcs.

Note that the necessity of the direct current sensor 12 is high in diagnosing the power conversion device. However, there is a challenge for exclusion of the direct current sensor 12 from the viewpoint of the cost. The calculation of the estimated direct current and the calculation of the correction value described in the present embodiment can also be used for the above-described challenge for excluding the direct current sensor 12. By accurately estimating the direct current value using the content of the present embodiment, the cost can be reduced by excluding the direct current sensor 12 while the accuracy equivalent to the case including the direct current sensor 12 is maintained.

The present invention is not limited to the above-described embodiments and includes various modifications. For example, the above embodiments have been described in detail for easy understanding of the present invention, and the present invention is not necessarily limited to one including all the described configurations. Further, a part of the configuration of a certain embodiment can be replaced with the configuration of another embodiment. Further, to the configuration of a certain embodiment, the configuration of another embodiment can be added. Further, for a part of the configurations of the embodiments, another configuration can be added/deleted/replaced. Further, a part or all of the above-described configurations, functions, processing units, and processing means may be realized by hardware by being designed with an integrated circuit or the like. Further, the above-described configurations, functions, and the like may be realized by software in such a manner that programs that realize the respective functions are interpreted and executed by the processor. Information such as programs, tables, and files that realize the functions can be stored in a recording device such as a memory, a hard disk, or a solid state drive (SSD), or in a recording medium such as an IC card, an SD card, or a DVD.

REFERENCE SIGNS LIST

1 power conversion device
1*a* power conversion device
1*b* power conversion device
5 target torque
6 abnormality notification signal
9 inverter circuit
9*a* inverter circuit
12 direct current sensor
14*a* alternating current sensor
14*b* alternating current sensor
14*c* alternating current sensor
16 inverter control device
16*a* inverter control device
16*b* inverter control device
22*a* PWM signal
22*b* PWM signal
22*c* PWM signal
22*d* PWM signal
22*e* PWM signal
22*f* PWM signal
22*g* PWM signal
22*h* PWM signal
22*i* PWM signal
22*j* PWM signal
22*k* PWM signal
22*l* PWM signal
25 direct current sensor diagnostic unit
25*a* direct current sensor diagnostic unit
25*b* direct current sensor diagnostic unit
26 estimated direct current calculation unit
26*a* estimated direct current calculation unit
28 comparison unit
28*a* comparison unit
28*b* comparison unit
29 correction value calculation unit
Idcc estimated direct current value after correction
Du duty value
Dv duty value
Dw duty value
Du1 duty value
Du2 duty value
Dv1 duty value
Dv2 duty value
Dw1 duty value
Dw2 duty value
Ic correction value
Idce1 estimated direct current value
Idce2 estimated direct current value
Idcs direct current sensor value
Ius alternating current sensor value
Ivs alternating current sensor value
Iws alternating current sensor value

The invention claimed is:

1. An apparatus comprising:
   an inverter control device that controls an inverter circuit which converts direct current into three-phase alternating current, the inverter control device being configured to
      calculate an estimated direct current value on the basis of duty values of three phases and alternating current sensor values of the three phases output by alternating current sensors, and
      perform diagnosis of a direct current sensor on the basis of the estimated direct current value and a direct current sensor value output by the direct current sensor, wherein
         each of the duty values represents an ON time ratio of each phase and fluctuates between 0% and 100%.

2. The apparatus according to claim 1, further configured to
   correct the estimated direct current value on the basis of a sum of alternating current values of the alternating current sensor values, and perform the diagnosis of the direct current sensor on the basis of an estimated direct current value after correction and the direct current sensor value.

3. The apparatus according to claim 2, further configured to
   perform filtering processing for the estimated direct current value after correction, and perform the diagnosis of the direct current sensor on the basis of an estimated direct current value after filtering and the direct current sensor value.

4. The apparatus according to claim 1, further configured to
output an abnormality notification signal when determining that the direct current sensor is abnormal.

5. The apparatus according to claim 4, further configured to
control the inverter circuit in such a way that a motor is driven according to target torque, and
control the inverter circuit in such a way that the motor is not driven when determining that the direct current sensor is abnormal.

6. A power conversion device comprising:
an inverter circuit which converts direct current into three-phase alternating current;
alternating current sensors;
a direct current sensor; and
an inverter control unit, wherein
the inverter control unit controls the inverter circuit in such a way that a motor is driven according to target torque, and computes an estimated direct current value on the basis of duty values of three phases and alternating current sensor values of the three phases output by the alternating current sensors,
performs diagnosis of the direct current sensor on the basis of the estimated direct current value and a direct current sensor value output by the direct current sensor, and
each of the duty values represents an ON time ratio of each phases and fluctuates between 0% and 100%.

7. The power conversion device according to claim 6, wherein
the inverter control unit corrects the estimated direct current value on the basis of a sum of alternating current values of the alternating current sensor values, and performs the diagnosis of the direct current sensor on the basis of an estimated direct current value after correction and the direct current sensor value.

8. The power conversion device according to claim 7, wherein
the inverter control unit performs filtering processing for the estimated direct current value after correction, and performs the diagnosis of the direct current sensor on the basis of an estimated direct current value after filtering and the direct current sensor value.

9. The power conversion device according to claim 6, wherein
the inverter control unit outputs an abnormality notification signal when determining that the direct current sensor is abnormal.

10. The power conversion device according to claim 9, wherein
the inverter control unit controls the inverter circuit in such a way that the motor is not driven when determining that the direct current sensor is abnormal.

11. A power conversion device comprising:
an inverter circuit which converts direct current into three-phase alternating current;
alternating current sensors; and
an inverter control unit, wherein
the inverter control unit controls the inverter circuit in such a way that a motor is driven according to target torque, and computes an estimated direct current value on the basis of duty values of three phases and alternating current sensor values of the three phases output by the alternating current sensors,
performs diagnosis of the power conversion device on the basis of the estimated direct current value, and
each of the duty values represents an ON time ratio of each phases and fluctuates between 0% and 100%.

12. The power conversion device according to claim 11, wherein
the inverter control unit corrects the estimated direct current value on the basis of a sum of alternating current values of the alternating current sensor values, and performs the diagnosis of the power conversion device on the basis of an estimated direct current value after correction.

13. The power conversion device according to claim 12, wherein
the inverter control unit performs filtering processing for the estimated direct current value after correction, and performs the diagnosis of the power conversion device on the basis of an estimated direct current value after filtering.

* * * * *